US006946887B2

(12) United States Patent
Ho

(10) Patent No.: US 6,946,887 B2
(45) Date of Patent: Sep. 20, 2005

(54) PHASE FREQUENCY DETECTOR WITH PROGRAMMABLE MINIMUM PULSE WIDTH

(75) Inventor: Shiu C. Ho, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,178

(22) Filed: Nov. 25, 2003

(65) Prior Publication Data

US 2005/0110536 A1 May 26, 2005

(51) Int. Cl.7 .................................................. H03L 7/06

(52) U.S. Cl. ....................... 327/156; 327/158; 327/161; 327/7; 327/8

(58) Field of Search ............................. 327/3, 7, 8, 10, 327/156, 158, 159, 160–1, 148, 157

(56) References Cited

U.S. PATENT DOCUMENTS 4,970,475 A * 11/1990 Gillig .......................... 331/25
6,049,233 A * 4/2000 Shurboff ........................ 327/2
6,144,242 A * 11/2000 Jeong et al. ................ 327/269
6,285,219 B1 * 9/2001 Pauls ............................ 327/3
6,320,424 B1 * 11/2001 Kurd et al. .................... 327/8
6,326,812 B1 * 12/2001 Jefferson ..................... 326/93
6,621,320 B2 * 9/2003 Wong et al. ................ 327/262

* cited by examiner

*Primary Examiner*—Timothy P. Callahan
*Assistant Examiner*—An T. Luu
(74) *Attorney, Agent, or Firm*—Schmeiser, Olsen & Watts; Richard A. Henkler

(57) ABSTRACT

A structure and associated method for reducing a static phase error in a phase-locked loop circuit. The phase-locked loop circuit comprises a voltage controlled oscillator and a phase frequency detector. The voltage controlled oscillator is adapted to provide a first clock signal comprising a first frequency. The phase frequency detector is adapted to compare the first clock signal comprising the first frequency to a reference clock signal comprising a reference frequency. The phase frequency detector comprises a programmable circuit adapted to vary a minimum pulse width of an increment pulse and a minimum pulse width of a decrement pulse. The programmable circuit is further adapted to reduce a static phase error of the phase locked-loop circuit.

12 Claims, 4 Drawing Sheets

PHASE FREQUENCY DETECTOR WITH PROGRAMMABLE MINIMUM PULSE WIDTH

BACKGROUND OF INVENTION

1. Technical Field

The present invention relates to a structure and associated method to reduce an amount of static phase error in a phase-locked loop circuit.

2. Related Art

Electrical circuits are typically required to operate with a plurality of electrical signals comprising different electrical properties. An inability to operate with plurality of electrical signals comprising different electrical properties may cause an electrical circuit to malfunction. Therefore there exists a need to design electrical circuits to operate with a plurality of electrical signals comprising different electrical properties.

SUMMARY OF INVENTION

The present invention provides a phase-locked loop circuit comprising:

a voltage controlled oscillator adapted to provide a first signal comprising a first frequency; and a phase frequency detector adapted to compare the first signal comprising the first frequency to a reference clock signal comprising a reference frequency, the phase frequency detector comprising a programmable circuit adapted to vary a minimum pulse width of an increment pulse and a minimum pulse width of a decrement pulse, the programmable circuit being further adapted to reduce a static phase error of the phase locked-loop circuit.

The present invention provides a method for reducing a static phase error in a phase-locked loop circuit comprising:

providing a voltage controlled oscillator and a phase frequency detector, the phase frequency detector comprising a programmable circuit;

generating by the voltage controlled oscillator, a first signal comprising a first frequency;

comparing by phase frequency detector, the first signal comprising the first frequency to a reference clock signal comprising a reference frequency;

varying by the programmable circuit, a minimum pulse width of an increment pulse and a minimum pulse width of a decrement pulse; and reducing by the programmable circuit, a static phase error of the phase-locked loop circuit.

The present invention advantageously provides a structure and associated method to design electrical circuits to operate with a plurality of electrical signals comprising different electrical properties.

DETAILED DESCRIPTION

Figure 1:
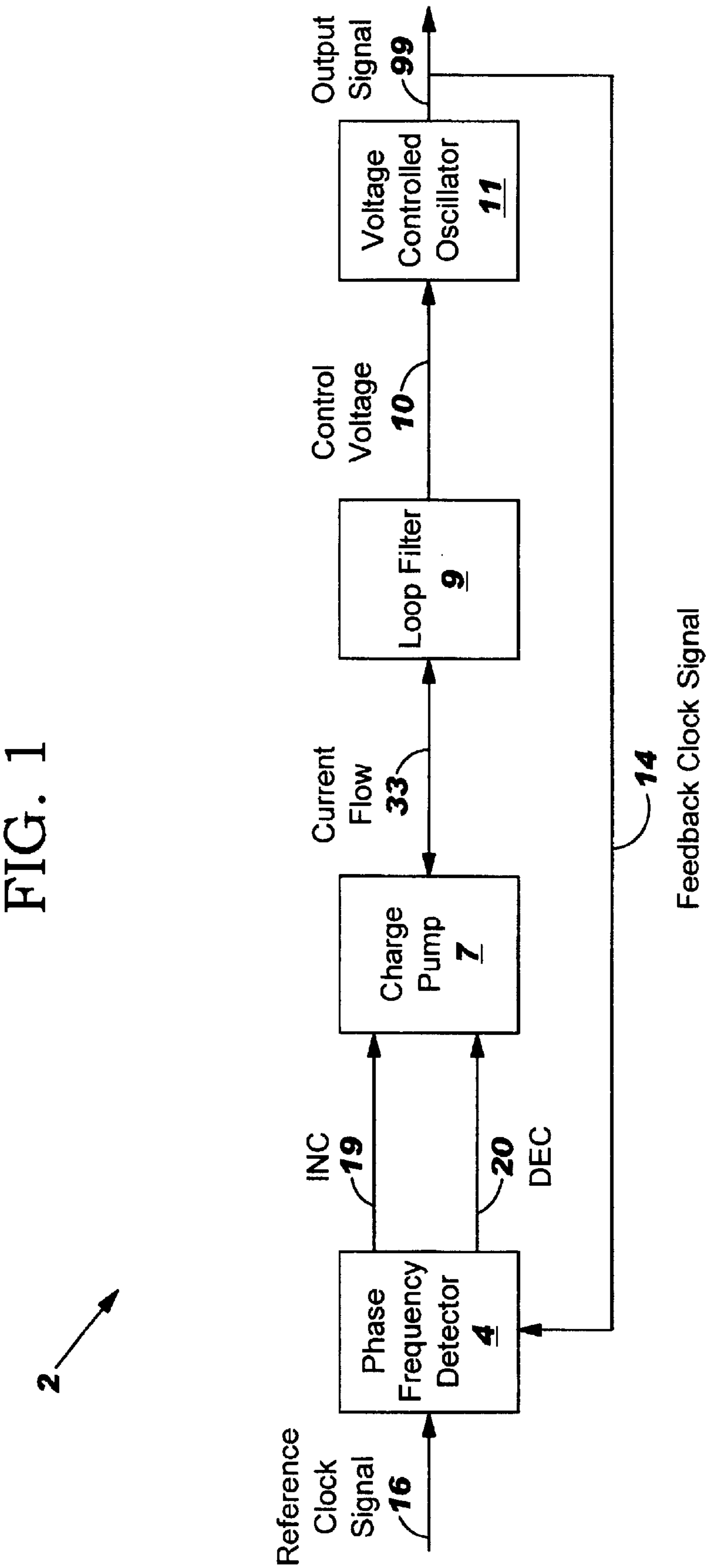
FIG. 1 illustrates a block diagram view of a phase-locked loop (PLL) circuit, in accordance with embodiments of the present invention.

FIG. 1 illustrates a block diagram of a phase-locked loop (PLL) circuit 2 comprising a phase frequency detector 4, a charge pump 7, a loop filter 9, and a voltage controlled oscillator (VCO) 11, in accordance with embodiments of the present invention. The phase frequency detector 4 is electrically connected to the charge pump 7. The charge pump 7 is electrically connected to the loop filter 9. The loop filter 9 is electrically connected to the VCO 11. The VCO 11 is electrically connected to the phase frequency detector 4. The phase frequency detector 4 compares a phase and frequency of a reference clock signal 16 to a phase and frequency of a feedback clock signal 14 from the VCO 11. The phase frequency detector 4 generates an output comprising an increment (INC) pulse 19 and a decrement (DEC) pulse 20. The INC pulse signal 19 and the DEC pulse 20 represent a phase and frequency difference between the reference clock signal 16 and the feedback clock signal 14. The feedback clock signal 14 is equivalent to the output signal 99. When a phase of the feedback clock signal 14 is lagging a phase of the reference clock signal 16, a pulse width of the INC pulse 19 is set wider than a pulse width of the DEC pulse 20. When a phase of the feedback clock signal 14 is leading a phase of the reference clock signal 16, the pulse width of the DEC pulse 20 is set wider than the pulse width of the INC pulse 19. When a phase of the feedback clock signal 14 is about equal to a phase of the reference clock signal 16, the pulse width of the DEC pulse 20 is about equal to the pulse width of the INC pulse 19. In this case, the pulse width of both INC pulse 19 and DEC pulse 20 is defined to be "the minimum pulse width" generated by a phase frequency detector 4. (the generation of the minimum pulse width is described in detail in the description of FIG. 2). The INC pulse 19 and the DEC pulse 20 are transmitted to the charge pump 7. The INC pulse 19 and the DEC pulse 20 control the charge pump 7 to source or sink a current 33 to/from the loop filter 9. Based on an amount and the direction (i.e., source or sink) of the current flow, the loop filter 9 produces a control voltage 10. The control voltage 10 controls the VCO 11 to produce an output signal 99 that tracks the reference clock signal 16 (i.e., output signal 99 tracks a phase and frequency of the reference clock signal 16). Ideally, the PLL circuit 2 is referred to as "locked" when the output signal 99 tracks the phase and frequency of the reference clock signal 16. Due to a process mismatch and circuit performance, a very small difference (e.g., +300 picoseconds) may exist between a phase of the output signal 99 and a phase of the reference clock signal 16, even when the PLL circuit is locked. This difference in phase is referred to as a static phase error.

Figure 2:
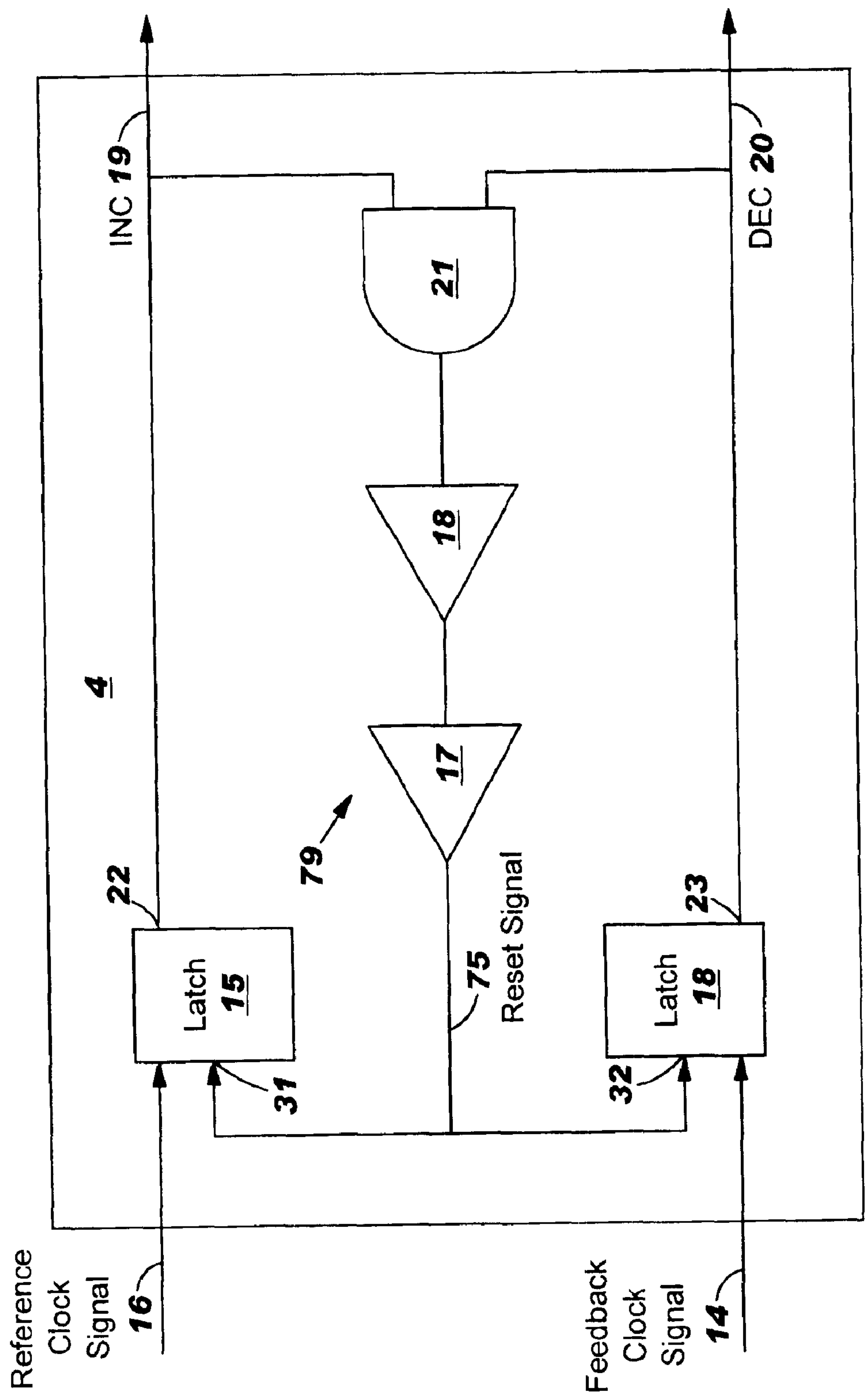
FIG. 2 illustrates a schematic of the phase frequency detector of FIG. 1, in accordance with embodiments of the present invention.

FIG. 2 illustrates a schematic of the phase frequency detector 4 of FIG. 1, in accordance with embodiments of the present invention. The phase frequency detector 4 comprises a latch 15, latch 18, a buffer 17, buffer 18, and an AND gate 21. The latch 15 is an edge triggered latch that detects a rising edge of the reference clock signal 16. The latch 18 is an edge triggered latch that detects a rising edge of the feedback clock signal 14. When a rising edge of the reference clock signal 16 is detected, an output 22 of the latch 15 will be set to a logical high. Similarly, when a rising edge of the feedback clock signal 14 is detected, an output 23 of the latch 18 will be set to a logical high. When the reference clock signal 16 and the feedback clock signal 14 are in phase, both the output 22 of the latch 15 and the output 23 of the latch 18 will be set to a logical high simultaneously. The AND gate 21 detects the logical high on both the output 22 of the latch 15 and the output 23 of the latch 18 and generates a reset pulse 75 to force the latches 14 and 18 to set the output 22 of the latch 15 and the output 23 of the latch 18 back to a logical low, thereby completing a formation of the INC pulse 19 and DEC pulse 20. A time delay required for the AND gate 21 to generate the reset pulse 75 and a time required for the reset pulse 75 to propagate to input 31 of the latch 15 and input 32 of the latch 18 determines a minimum pulse width of the INC pulse 19 and the DEC pulse 20. A width of the minimum pulse width of the INC pulse 19 and the DEC pulse 20 is chosen based on the following two requirements:

1. To ensure the minimum pulse width is short enough such that it does not extend into a next cycle of the reference clock signal 16 thereby causing the phase frequency detector 4 to miss a following rising edge.

2. To ensure the minimum pulse width is wide enough to maintain a linearity of the phase frequency detector 4 and the charge pump 7 combinations.

As a frequency range of the reference clock signal 16 increases, both of the aforementioned conditions are difficult to satisfy at the same time. Since the first requirement is a functional issue to a PLL, PLL designers generally select to satisfy the first requirement (i.e., ensuring the minimum pulse width is short enough) when the input reference clock frequency is high (e.g., about 800 MHz), while violating the second requirement (i.e., ensuring the minimum pulse width is wide enough) with the expense of a higher static phase error when input reference clock frequency is low (e.g., less than about 100 MHz). Ideally, the delay 79 should be controlled (i.e., programmable) such that the delay 79 is fixed at an acceptable percentage of the reference clock period thereby satisfying the first requirement (i.e., ensuring the minimum pulse width is short enough) while reducing a static phase error and satisfying the second requirement (i.e., ensuring the minimum pulse width is wide enough). A programmable delay to maintain a low static phase error while increasing the operating range of the input reference clock frequency is described in the descriptions of FIG. 3 and FIG. 4.

Figure 3:
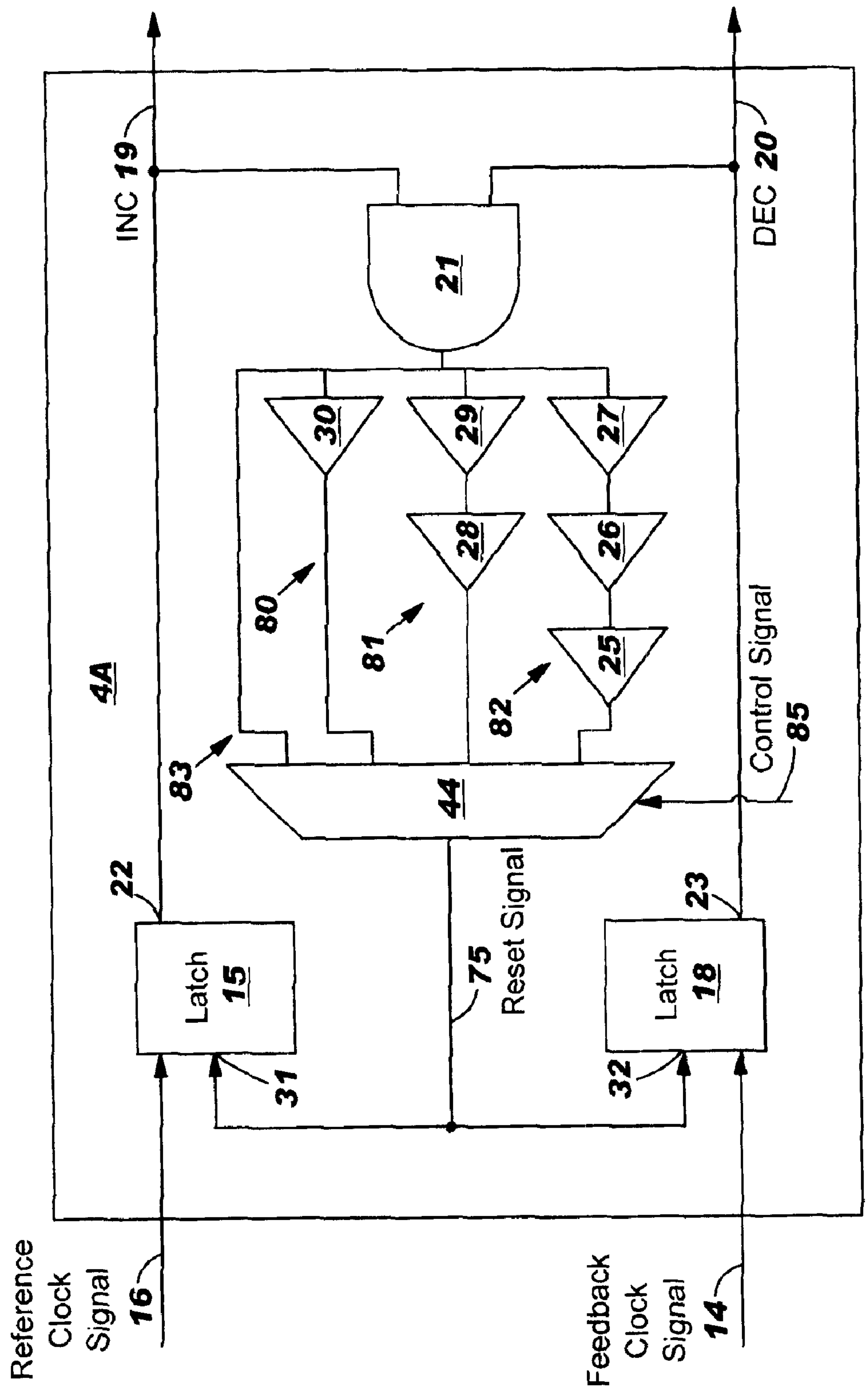
FIG. 3 illustrates a modified schematic of the phase frequency detector of FIG. 2, in accordance with embodiments of the present invention.

FIG. 3 illustrates a modified schematic of the phase frequency detector 4 of FIG. 2 represented by phase frequency detector 4A, in accordance with embodiments of the present invention. In contrast with the phase frequency detector 4 of FIG. 2, the phase frequency detector 4A of FIG. 3 comprises a digital programmable delay system. The phase frequency detector 4A comprises a plurality of delay paths 80, 81, and 82 electrically connected in parallel between the AND gate 21 and a multiplexer 44. The delay path 80 is represented by the buffer 30. The delay path 81 is represented by the buffers 28 and 29 electrically connected in series. The delay path 82 is represented by the buffers 25, 26, and 27 electrically connected in series. A path 83 comprising no delays is electrically connected in parallel with delay paths 80, 81, and 82 between the AND gate 21 and a multiplexer 44. Each of delay paths 80, 81, 82 and 83 comprises a different amount of delay. It should be understood that the exact amount of delay is not limited to this particular embodiment as this particular embodiment is an example to those skilled in the art. A control signal 85 is applied to the multiplexer 44 to select between delay paths 80, 81, 82, and path 83. The control signal 85 may comprise digital control bits. The control signal 85 may be predetermined, based on simulations or hardware measurements. The control signal 85 may be programmed in the field using, inter alia, a keyboard, a keypad, a computer, etc. A proper path (i.e., delay paths 80, 81, 82 or path 83) comprising a proper amount of delay is selected for the reset signal 75 to feed back to the latches 15 and 18. The proper amount of delay will vary the minimum pulse width of the INC pulse 19 and DEC pulse 20. When a frequency of the reference clock signal 16 is high (i.e., greater than 500 MHz), a minimum amount of delay (e.g., delay path 80 or 83) may be selected to ensure the minimum pulse width does not extend to the following rising edge of the reference clock signal 16. While violating the second requirement (i.e., ensuring the minimum pulse width is wide enough), the static phase error is minimal because of a high correction rate due to the high frequency (i.e., greater than 500 MHz) of the reference clock signal 16. When a frequency of the reference clock signal 16 is between 100 MHz and 500 MHz, an intermediate amount of delay (e.g., delay path 81) may be selected to partially satisfy both the first requirement and the second requirement. Since the correction rate to the loop filter 9 at this intermediate frequency range (i.e., 100 MHz–500 MHz) is still high, static phase error introduced by the nonlinearity from both the phase frequency detector 4 and the charge pump 7 is still relatively small. When a frequency of the reference clock signal 16 is low (i.e., less than 100 MHz), a maximum amount of delay (e.g., delay path 82) may be selected to ensure the linearity of the phase frequency detector 4 and the charge pump 7. Even though the correction rate to the loop filter 9 is low, there is no error introduced by the phase frequency detector 4 and the charge pump 7, therefore minimizing a static phase error of the phase-locked loop circuit 2 of FIG. 1. The reference frequency may be selected from a range of about 2 megahertz to about 1 gigahertz.

Figure 4:
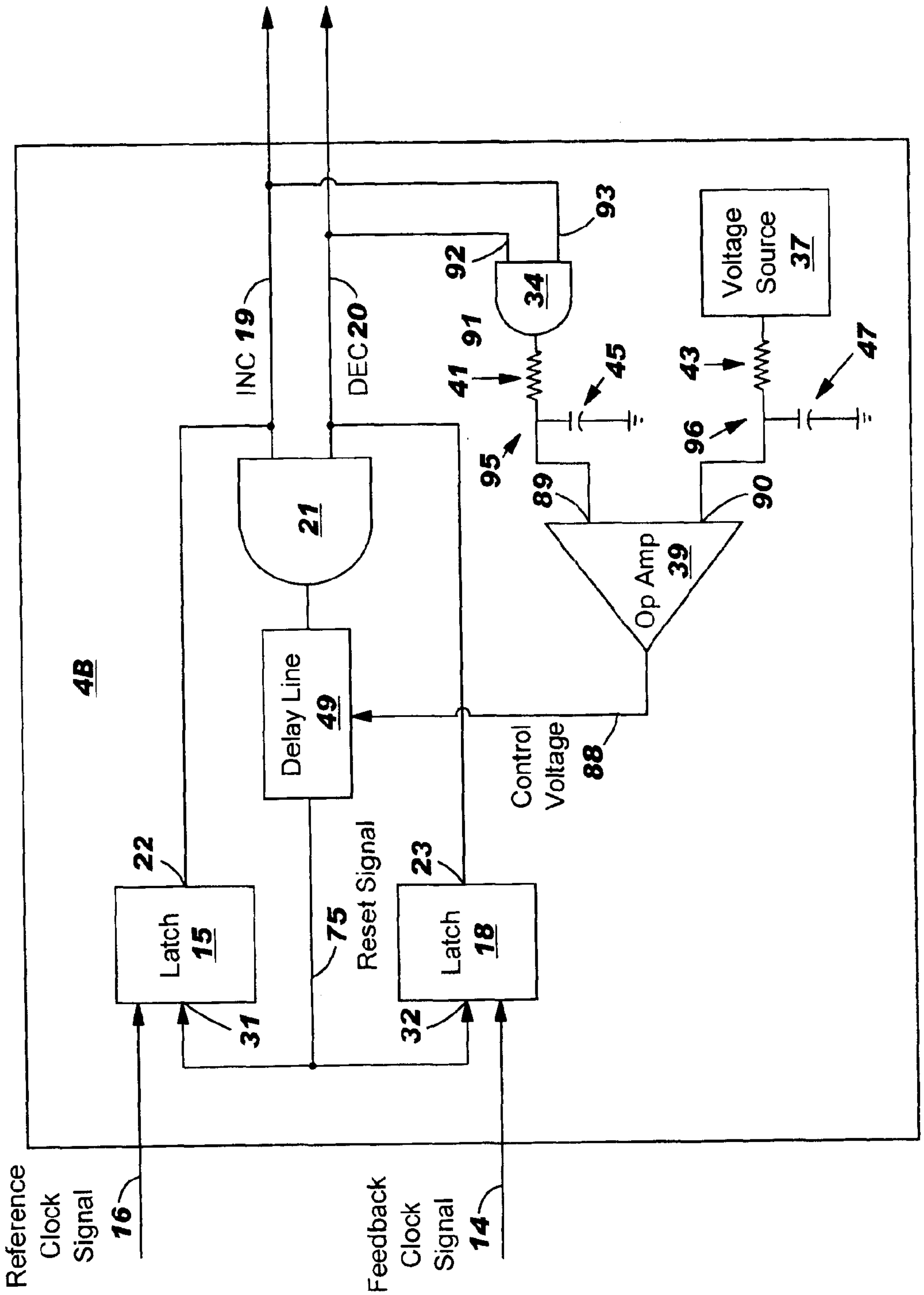
FIG. 4 illustrates a modified schematic of the phase frequency detector of FIG. 3, in accordance with embodiments of the present invention.

FIG. 4 illustrates a modified schematic of the phase frequency detector 4A of FIG. 3 represented by phase frequency detector 4B, in accordance with embodiments of the present invention. In contrast with the phase frequency detector 4A of FIG. 3, the phase frequency detector 4B of FIG. 4 comprises an analog programmable delay system. The delay paths delay paths 80, 81, 82 and path 83 in FIG. 3 have been replaced by delay line 49 in FIG. 4.

An input 93 of an AND gate 34 is electrically connected to the output 22 of the latch 15. An input 92 of the AND gate 34 is electrically connected to the output 23 of the latch 18. An output 91 of the AND gate 34 is electrically connected through a resistor/capacitor (R/C) network 95 comprising a resistor 41 and a capacitor 45 to a first input 89 of an operational amplifier 39. The capacitor 45 is electrically connected to ground. A voltage source 37 is electrically connected through an R/C network 96 comprising a resistor 43 and a capacitor 47 to a second input 90 of the operational amplifier 39. The capacitor 47 is electrically connected to ground. The voltage source 37 may be any voltage source known to a person of ordinary skill in the art including, inter alia, a digital to analog converter, etc. The inputs 92 and 93 of the AND gate 34 extract the minimum pulse width of the INC pulse 19 and DEC pulse 20. An output 91 of the AND gate 34 produces a digital signal according to the minimum pulse width of the INC pulse 19 and DEC pulse 20, together with a period of the reference clock signal 16. The R/C network 95 converts the digital signal into an analog voltage $V_{C1}$. The analog voltage $V_{C1}$ is applied to the first input 89 of an operational amplifier 39. The analog voltage $V_{C1}$ is created across the capacitor 45 and is determined by the following formula:

$V_{C1}=VDD*(PW_{MIN})/(REF_{PERIOD})$ (VDD is a supply voltage for the PLL circuit 2 (see FIG. 1), $PW_{MIN}$ is the minimum pulse width, $REF_{PERIOD}$ is a period of the reference clock signal 16).

An analog reference voltage $V_{C2}$ generated across the capacitor 47 by the voltage source 37 and the resistor 43 is applied to the second input 90 of the operational amplifier 39. The operational amplifier 39 compares the first analog voltage $V_{C1}$ across the first capacitor 45 to the analog reference voltage $V_{C2}$ across the second capacitor 47 and generates a control voltage 88 based on the comparison. The control voltage 88 adjusts a delay to the delay line 49 until $V_{C1}=V_{C2}$. As a result, the minimum pulse width of the INC pulse 19 and DEC pulse 20 has a fixed ratio with the reference clock signal 16 period. For example, if $V_{C2}=0.1*VDD$, the $PW_{MIN}=0.1*REF_{PERIOD}$. The minimum pulse width will change dynamically with the frequency of the reference clock signal 16, satisfying the requirement of a smaller minimum pulse width when the input reference clock frequency is high and the requirement of longer minimum pulse width when the input reference clock frequency is low. FIG. 4 is an alternative to the phase frequency detector 4A described in FIG. 3 which requires the control bits to be manually programmed based on the a frequency of the reference clock signal 16. The reference frequency may be selected from a range of about 2 megahertz to about 1 gigahertz.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A phase-locked loop circuit comprising:

a voltage controlled oscillator adapted to provide a first clock signal comprising a first frequency; and a phase frequency detector adapted to compare the first clock signal comprising the first frequency to a reference clock signal comprising a reference frequency, the phase frequency detector comprising a programmable circuit adapted to vary a minimum pulse width of an increment pulse and a minimum pulse width of a decrement pulse, the programmable circuit being further adapted to reduce a static phase error of the phase locked-loop circuit, wherein the programmable circuit comprises an operational amplifier, a first capacitor, a second capacitor, and a delay line wherein the operational is adapted to compare a first analog voltage across the first capacitor to a reference voltage across the second capacitor and generate a control voltage based on the comparison, wherein the control voltage is adapted to control the delay line to vary the minimum pulse width of the increment pulse and the minimum pulse width of the decrement pulse, and wherein the minimum pulse width of the increment pulse and the minimum pulse width of the decrement pulse comprise a fixed fraction of a period of the reference clock signal.

2. The phase-lock loop circuit of claim 1, wherein the programmable circuit further comprises an AND gate adapted to extract the minimum pulse width of the increment pulse and the minimum pulse width of a decrement pulse.

3. The phase-locked loop circuit of claim 2, wherein the programmable circuit further comprises a resistor, and wherein the resistor and the first capacitor are collectively adapted to convert a digital signal from a output of the AND gate into the first analog voltage across the first capacitor.

4. The phase-locked loop circuit of claim 3, wherein the first analog voltage across the first capacitor is equal to a supply voltage of the phase-locked loop circuit multiplied by the minimum pulse width of the increment pulse and divided by the period of the reference clock signal.

5. The phase-locked loop circuit of claim 3, wherein the first analog voltage across the first capacitor is equal to a supply voltage of the phase-locked loop circuit multiplied by the minimum pulse width of the decrement pulse and divided by the period of the reference clock signal.

6. The phase-locked loop circuit of claim 1, wherein the reference voltage is generated by a digital to analog converter.

7. A method for reducing a static phase error in a phase-locked loop circuit comprising;

providing a voltage controlled oscillator and a phase frequency detector, the phase frequency detector comprising a programmable circuit, the programmable circuit comprising an operational amplifier, a first capacitor, a second capacitor, and a delay line;

generating by the voltage controlled oscillator, a first clock signal comprising a first frequency;

comparing by phase frequency detector, the first clock signal comprising the first frequency to a reference clock signal comprising a reference frequency;

varying by the programmable circuit, a minimum pulse width of an increment pulse and a minimum pulse width of a decrement pulse;

reducing by the programmable circuit, a static phase error of the phase-locked loop circuit;

comparing by the operational amplifier, a first analog voltage across the first capacitor to a reference voltage across the second capacitor;

generating by the operational amplifier, a control voltage based on the comparison; and controlling by the control voltage, the delay line to vary the minimum pulse width of the increment pulse and the minimum pulse width of the decrement pulse, wherein the minimum pulse width of the increment pulse and the minimum pulse width of the decrement pulse comprise a fixed fraction of period of the reference clock signal.

8. The method of claim 7, further comprising:

providing within the programmable circuit, an AND gate; and extracting by the AND gate, the minimum pulse width of the increment pulse and the minimum pulse width of the decrement pulse.

9. The method of claim 8, further comprising:

providing within the programmable circuit, a resistor; and collectively converting by the resistor and the first capacitor, a digital signal from an output of the AND gate into the first analog voltage across the first capacitor.

10. The method of claim 9, wherein the first analog voltage across the first capacitor is equal to a supply voltage multiplied by the minimum pulse width of the increment pulse and divided by the period of the reference clock signal.

11. The method of claim 9, wherein the first analog voltage across the first capacitor is equal to a supply voltage multiplied by the minimum pulse width of the decrement pulse and divided by a period of the reference clock signal.

12. The method of claim 7, further comprising generating by a digital to analog converter, the reference voltage.

* * * * *